United States Patent
Okuda

(10) Patent No.: US 7,468,619 B2
(45) Date of Patent: Dec. 23, 2008

(54) ELECTRICAL LOAD DRIVE DEVICE

(75) Inventor: Shouichi Okuda, Nukata-gun (JP)

(73) Assignee: Denso Corporation, Kariya (JP)

( * ) Notice: Subject to any disclaimer, the term of this patent is extended or adjusted under 35 U.S.C. 154(b) by 39 days.

(21) Appl. No.: 11/806,323

(22) Filed: May 31, 2007

(65) Prior Publication Data

US 2007/0296468 A1  Dec. 27, 2007

(30) Foreign Application Priority Data

Jun. 9, 2006 (JP) .............................. 2006-160840

(51) Int. Cl.
*H03B 1/00* (2006.01)

(52) U.S. Cl. .................. 327/108; 327/109; 327/110; 361/78; 323/282

(58) Field of Classification Search ......... 327/108–112, 327/378; 361/56–58, 78, 86–87; 323/224, 323/282–284

See application file for complete search history.

(56) References Cited

U.S. PATENT DOCUMENTS 6,958,592 B2 * 10/2005 Chapuis ..................... 323/246

2006/0087348 A1  4/2006 Ota et al.

FOREIGN PATENT DOCUMENTS

| JP | A-10-264765 | 10/1998 |
| JP | A-10-297420 | 11/1998 |
| JP | A-2005-088748 | 4/2005 |

* cited by examiner

*Primary Examiner*—An T. Luu
(74) *Attorney, Agent, or Firm*—Posz Law Group, PLC

(57) ABSTRACT

A load drive device for driving an electrical load includes high-side and low-side transistors, and a switch. When the load is driven, each of the high-side and low-side transistors operates in a first mode where each of the high-side and low-side transistors is fully tuned on or in a second mode where each of the high-side and low-side transistors is controlled so that a load current flowing through the load is constant. When the load is driven, there is a first state where the high-side transistor operates in the second mode and the low-side transistor operates in the first mode and a second state where the high-side transistor operates in the first mode and the low-side transistor operates in the second mode. The switch switches between the first and second states to distribute heat generation between the high-side and low-side transistors.

7 Claims, 13 Drawing Sheets

ELECTRICAL LOAD DRIVE DEVICE

CROSS REFERENCE TO RELATED APPLICATION

This application is based on and incorporates herein by reference Japanese Patent Application No. 2006-160840 filed on Jun. 9, 2006.

FIELD OF THE INVENTION

The present invention relates to an electrical load drive device for driving an electrical load.

BACKGROUND OF THE INVENTION

As disclosed in, for example, JP-A-10-264765, JP-A-10-297420, and JP-A-2005-88748, an electrical load drive circuit has been proposed that drives an electrical load, (e.g., airbag squib) by using a high-side transistor and a low-side transistor. FIG. 14 shows a conventional airbag squib drive circuit for driving an airbag squib 110 (e.g., resistor). The squib drive circuit is implemented on an integrated circuit (IC) chip 100 and the squib 110 is connected to the IC chip 100. The IC chip 100 includes a high-side metal-oxide semiconductor field-effect transistor (MOSFET) Q10 and a low-side MOSFET Q11.

In the IC chip 100, a current detection resistor 101 detects a load current flowing through the squib 110. A comparator 102 compares a voltage drop across the current detection resistor 101 with a reference voltage. An output of the comparator 102 is fed to a high-side gate driver 103. A control signal Sc of a control logic 105 is fed to the high-side gate driver 103 via an AND gate 104. An output of the high-side gate driver 103 is fed to the gate of the high-side MOSFET Q10 so that the high-side gate driver 103 can drive the high-side MOSFET Q10.

A control signal Sc of a control logic 107 is fed to a low-side gate driver 109 via an NAND gate 108. An output of the low-side gate driver 109 is fed to the gate of the low-side MOSFET Q11 so that the low-side gate driver 109 can drive the low-side MOSFET Q11. A timer signal St of a timer 106 is fed to each of the AND gate 104 and the NAND gate 108.

As shown in FIG. 15, during a time period (i.e., between times t1, t3) when both the control signal Sc and the timer signal St are set to a high level, a gate-source voltage Vds11 of the low-side MOSFET Q11 is held high so that the low-side MOSFET Q11 is fully turned on. In contrast, during the time period, a gate source voltage Vgs10 of the high-side MOSFET Q10 is adjusted so that the load current flowing through the squib 110 can be held constant.

As shown in FIG. 15, during the time period when both the control signal Sc and the timer signal St are set to the high level, a drain-source voltage Vds11 of the low-side MOSFET 11 is low, because the low-side MOSFET Q11 is fully turned on. Accordingly, heat generated by the low-side transistor Q11 is small, and temperature of the low-side transistor Q11 is low. Therefore, the low-side transistor Q11 has a sufficient thermal margin so that the low-side transistor Q10 can be prevent from being thermally damaged or destroyed.

In contrast, during the time period, a drain-source voltage Vds10 of the high-side MOSFET Q10 is high, because a large portion of a power supply voltage Vdd is applied between the drain and source of the high-side MOSFET Q10. Accordingly, heat generated by the high-side MOSFET Q10 is large, and temperature of the high-side MOSFET Q10 becomes high. Therefore, the high-side transistor Q10 does not have the sufficient thermal margin so that the high-side transistor Q10 may be thermally damaged or destroyed.

Further, the large heat generated by the high-side transistor Q10 may affect peripheral circuits of the IC chip 100 and active elements placed near the high-side transistor Q10. One approach to this problem is to increase the size of the high-side MOSFET Q10. However, the increase in size results in an increase in cost.

SUMMARY OF THE INVENTION

In view of the above-described problem, it is an object of the present invention to provide an electrical load drive device, in which a high-side transistor and a low-side transistor work in conjunction with each other to drive an electrical load with reduced heat generation.

An electrical load drive device for driving an electrical load includes a high-side transistor, a low-side transistor, first full-on means, first constant means, second full-on means, second constant means, and switching means.

The high-side transistor is connected between a higher voltage terminal connected to, for example, a power supply and the electrical load. The low-side transistor is connected between the electrical load and a lower voltage terminal connected to, for example, a ground.

The first full-on means causes the high-side transistor to operate in a first full-on control mode where the high-side transistor is fully tuned on. The first constant means causes the high-side transistor to operate in a first constant control mode where the high-side transistor is controlled so that a load current flowing through the electrical load is constant. The second full-on means causes the low-side transistor to operate in a second full-on control mode where the low-side transistor is fully tuned on. The second constant means causes the low-side transistor to operate in a second constant control mode where the low-side transistor is controlled so that the load current flowing through the electrical load is constant.

The switching means switches a state from a first state to a second state and/or from the second state to the first state. In the first state, the high-side transistor operates in the first constant control mode and the low-side transistor operates in the second full-on control mode. In the second state, the high-side transistor operates in the first full-on control mode and the low-side transistor operates in the second constant control mode.

When the electrical load is driven, the amount of heat generated by the high-side transistor is greater in the first constant control mode than in the first full-on control mode. Likewise, the amount of heat generated by the low-side transistor is greater in the second constant control mode than in the second full-on control mode.

According to the electrical load drive device, the switching means switches the state from the first state to the second state and/or from the second state to the first state to distribute the heat between the high-side transistor and the low-side transistor. Thus, the high-side transistor and the low-side transistor works in conjunction with each other to drive the electrical load with reduced heat generation. Therefore, each of the high-side transistor and the low-side transistor can have a sufficient thermal margin without an increased in size.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
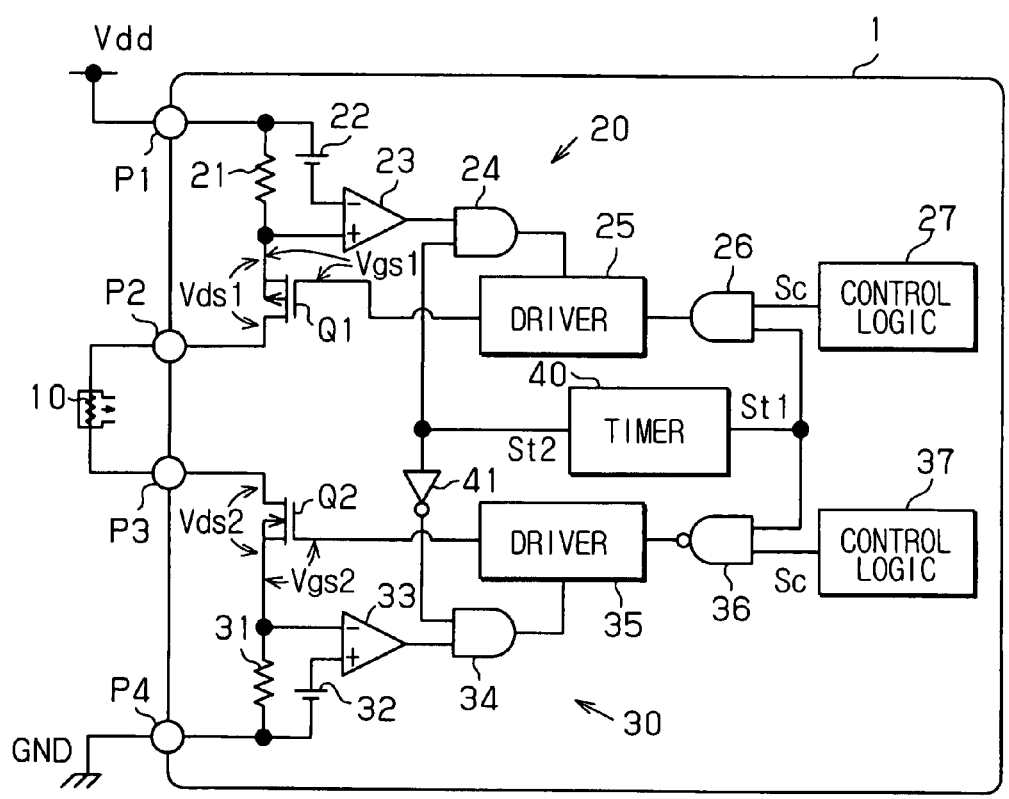
FIG. 1 is a block diagram of a load drive device according to a first embodiment of the present invention.

An airbag squib drive circuit according to a first embodiment of the present invention is implemented on an integrated circuit (IC) chip 1 shown in FIG. 1. The IC chip 1 has first, second, third, and fourth terminals P1-P4. The first terminal P1 is connected to a power supply voltage Vdd. An airbag squib 10 is connected between the second and third terminals P2, P3. The squib 10 may be, for example, a resistor. The fourth terminal P4 is connected to ground GND.

As shown in FIG. 1, the IC chip 1 includes a high-side transistor Q1, a low-side transistor Q2, a high-side drive circuit 20, a low-side drive circuit 30, and a timer 40. The high-side drive circuit 20 includes a current detection resistor 21, a constant voltage source 22, a comparator 23, AND gates 24, 26, a high-side gate driver 25, and a control logic 27. The low-side drive circuit 30 includes a current detection resistor 31, a constant voltage source 32, a comparator 33, a AND gate 34, a low-side gate driver 35, a NAND gate 36, and a control logic 37.

The current detection resistor 21 and the high-side transistor Q1 are connected in series between the first and second terminals P1, P2 of the IC chip 1. The low-side transistor Q2 and the current detection resistor 31 are connected in series between the third and fourth terminals P3, P4 of the IC chip 1. Therefore, the high-side transistor Q1 is connected between the power supply voltage Vdd and the squib 10, and the low-side transistor Q2 is connected between the squib 10 and the ground GND.

For example, a laterally diffused metal oxide semiconductor (LDMOS) may be used as the high-side and low-side transistors Q1, Q2. In this embodiment, as shown in FIG. 1, a P-channel metal-oxide semiconductor field-effect transistor (MOSFET) is used as the high-side transistor Q1, and an a N-channel MOSFET is used as the low-side transistor Q2.

The high-side drive circuit 20 drives and controls the high-side transistor Q1 by adjusting a gate-source voltage Vgs1 of the high-side transistor Q1. A potential at a node between the current detection resistor 21 and the high-side transistor Q1 is applied to a positive input of the comparator 23. In short, a voltage drop produced by current flow across the current detection resistor 21 is applied to the positive input of the comparator 23. A reference voltage is applied from the constant voltage source 22 to a negative input of the comparator 23. Thus, the comparator 23 compares a corresponding voltage to a load current flowing through the squib 10 with the reference voltage applied from the constant voltage source 22.

The comparator 23 sends a result signal, depending on the result of the comparison, to a first input of the AND gate 24. An output of the AND gate 24 is fed to the high-side gate driver 25. The gate of the high-side transistor Q1 is connected to the high-side gate driver 25. The control logic 27 sends a control signal Sc to a first input of the AND gate 26. An output of the AND gate 26 is fed to the high-side gate driver 25. The timer 40 sends a first timer signal St1 to a second input of the AND gate 26. Also, the timer 40 sends a second timer signal St2 to a second input of the AND gate 24. The high-side gate driver 25 adjusts a gate-source voltage Vgs1 of the high-side transistor Q1.

The low-side drive circuit 30 drives and controls the low-side transistor Q2 by adjusting a gate-source voltage Vgs2 of the low-side transistor Q2. A potential at a node between the current detection resistor 31 and the low-side transistor Q2 is applied to a positive input of the comparator 33. In short, a voltage drop produced by current flow across the current detection resistor 31 is applied to the positive input of the comparator 33. A reference voltage is applied from the constant voltage source 32 to a negative input of the comparator 33. Thus, the comparator 33 compares the corresponding voltage to the load current flowing through the squib 10 with the reference voltage applied from the constant voltage source 32.

The comparator 33 sends a result signal, depending on the result of the comparison, to a first input of the AND gate 34. An output of the AND gate 34 is fed to the low-side gate driver 35. The gate of the low-side transistor Q2 is connected to the low-side gate driver 35. The control logic 37 sends the control signal Sc to a first input of the NAND gate 36. An output of the NAND gate 36 is fed to the low-side gate driver 35. The timer 40 sends the first timer signal St1 to a second input of the NAND gate 36. Also, the timer 40 sends the second timer signal St2 to a second input of the AND gate 34 via an NOT gate (i.e., inverter) 41. The low-side gate driver 35 adjusts a gate-source voltage Vgs2 of the low-side transistor Q2.

In FIG. 1, the high-side gate driver 25 forms first full-on means for causing the high-side transistor Q1 to operate in a full-on control mode, where the high-side transistor Q1 is continuously fully turned on. The current detection resistor 21, the constant voltage source 22, the comparator 23, the AND gate 24, and the high-side gate driver 25 forms first constant means for causing the high-side transistor Q1 to operate in a constant control mode, where the high-side transistor Q1 is controlled so that the load current flowing through the squib 10 is held constant.

The low-side gate driver 35 forms second full-on means for causing the low-side transistor Q2 to operate in a full-on control mode, where the low-side transistor Q2 is continuously fully turned on. The current detection resistor 31, the constant voltage source 32, the comparator 33, the AND gate 34, and the low-side gate driver 35 form second constant means for causing the low-side transistor Q2 to operate in a constant control mode, where the low-side transistor Q2 is controlled so that the load current flowing through the squib 10 is held constant.

The full-on control mode and the constant control mode are described below with respect to FIG. 2, where the constant voltage source 22, the comparator 23, the AND gates 24, 26, the high-side gate driver 25, the constant voltage source 32, the comparator 33, the AND gate 34, the low-side gate driver 35, and the NAND gate 36 are shown in detail.

Figure 2:
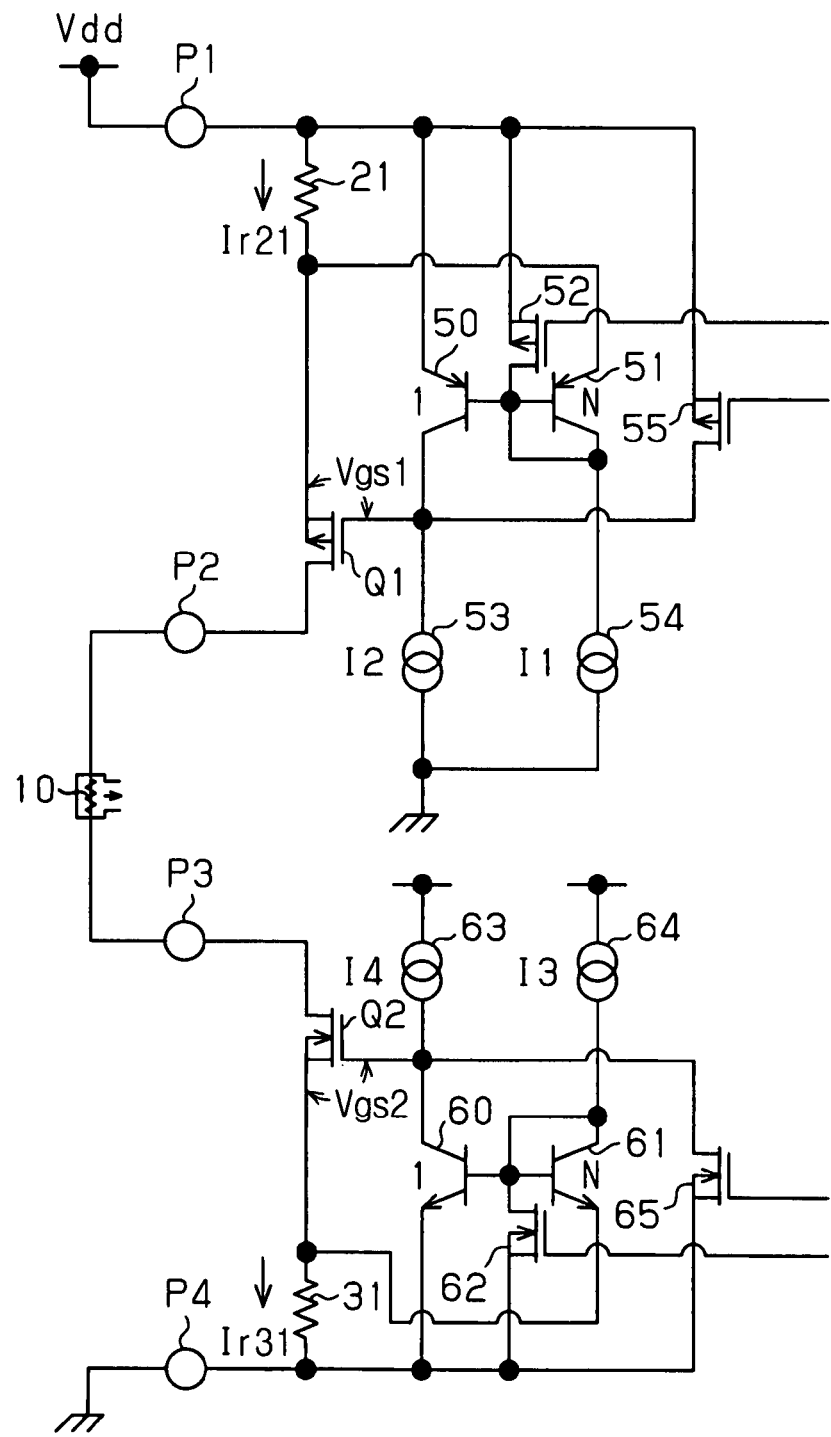
FIG. 2 is a schematic diagram of high-side and low-side drive circuits of the load drive device of FIG. 1.

As shown in FIG. 2, PNP transistors 50, 51 form a current mirror with mirror ration of 1:N, where N is a positive number. The bases of the transistors 50, 51 are connected to each other. The emitter of the transistor 50 is connected to the first terminal P1 of the IC chip 1, and the collector of the transistor 50 is connected to a constant current source 53 for supplying a second current I2. Also, the collector of the transistor 50 is connected to the gate of the high-side transistor Q1. The emitter of the transistor 51 is connected to the node between the current detection resistor 21 and the high-side transistor Q1, and the collector of the transistor 51 is connected to a constant current source 54 for supplying a first current I1. A P-channel MOS transistor 52 is connected between the first terminal P1 and each of the bases of the transistors 50, 51. A P-channel MOS transistor 55 is connected between the first terminal P1 and the gate of the high-side transistor Q1.

The high-side transistor Q1 operates in the full-on control mode as follows:

The gate of the transistor 52 is driven to a low level to turn on the transistor 52 under a condition where the transistor 55 remains off. As a result, the transistors 50, 51 are turned off so that the second current I2 can keep the gate-source voltage Vgs1 of the high-side transistor Q1 high enough to continuously fully turn on the high-side transistor Q1.

In contrast, the high-side transistor Q1 operates in the constant control mode as follows:

The gate of the transistor 52 is driven to a high level to turn off the transistor 52 under the condition where the transistor 55 remains off. In this case, a relationship between a current Ir21 flowing through the current detection resistor 21, a base-emitter voltage Vbe50 of the transistor 50, and a base-emitter voltage Vbe51 of the transistor 51 are given by:

$$Vbe50 = Vbe51 + R21*Ir21$$

Thus, the gate-source voltage Vgs1 of the high-side transistor Q1 is adjusted so that the load current flowing through the squib 10 can be held constant.

As shown in FIG. 2, NPN transistors 60, 61 form a current mirror with a mirror ratio of 1:N, where N is a positive number. The bases of the transistors 60, 61 are connected to each other. The emitter of the transistor 60 is connected to the fourth terminal P4 of the IC chip 1, and the collector of the transistor 60 is connected to a constant current source 63 for supplying a fourth current I4. Also, the collector of the transistor 60 is connected to the gate of the low-side transistor Q2. The emitter of the transistor 61 is connected to the node between the current detection resistor 31 and the low-side transistor Q2, and the collector of the transistor 61 is connected to a constant current source 64 for supplying a third current I3. A N-channel MOS transistor 62 is connected between the fourth terminal P4 and each of the bases of the transistors 60, 61. A N-channel MOS transistor 65 is connected between the fourth terminal P4 and the gate of the low-side transistor Q2.

The low-side transistor Q2 operates in the full-on control mode as follows:

The gate of the transistor 62 is driven to the high level to turn on the transistor 62 under a condition where the transistor 65 remains off. As a result, the transistors 60, 61 are turned off so that the fourth current I4 can keep the gate-source voltage Vgs2 of the low-side transistor Q2 high enough to continuously fully turn on the low-side transistor Q2.

In contrast, the low-side transistor Q2 operates in the constant control mode as follows:

The gate of the transistor 62 is driven to the low level to turn off the transistor 62 under the condition where the transistor 65 remains off. In this case, a relationship between a current Ir31 flowing through the current detection resistor 31, a base-emitter voltage Vbe60 of the transistor 60, and a base-emitter voltage Vbe61 of the transistor 61 are given by:

$$Vbe60 = Vbe61 + R31*Ir31$$

Thus, the gate-source voltage Vgs2, of the low-side transistor Q2 is adjusted so that the load current flowing through the squib 10 can be held constant.

The squib 10 can be deenergized by tuning on the transistors 55, 65.

In FIG. 2, the constant current source 53 forms the first full-on means for causing the high-side transistor Q1 to operate in the full-on control mode, where the high-side transistor Q1 is continuously fully turned on. The current detection resistor 21, the transistors 50, 51, and the constant current sources 53, 54 form the first constant means for causing the high-side transistor Q1 to operate in the constant control mode, where the high-side transistor Q1 is controlled so that the load current flowing through the squib 10 is held constant.

The constant current source 63 forms the second full-on means for causing the low-side transistor Q2 to operate in the full-on control mode, where the low-side transistor Q2 is continuously fully turned on. The current detection resistor 31, the transistors 60, 61, and the constant current sources 63, 64 form the second constant means for causing the low-side transistor Q2 to operate in the constant control mode, where the low-side transistor Q2 is controlled so that the load current flowing through the squib 10 is held constant.

Figure 3:
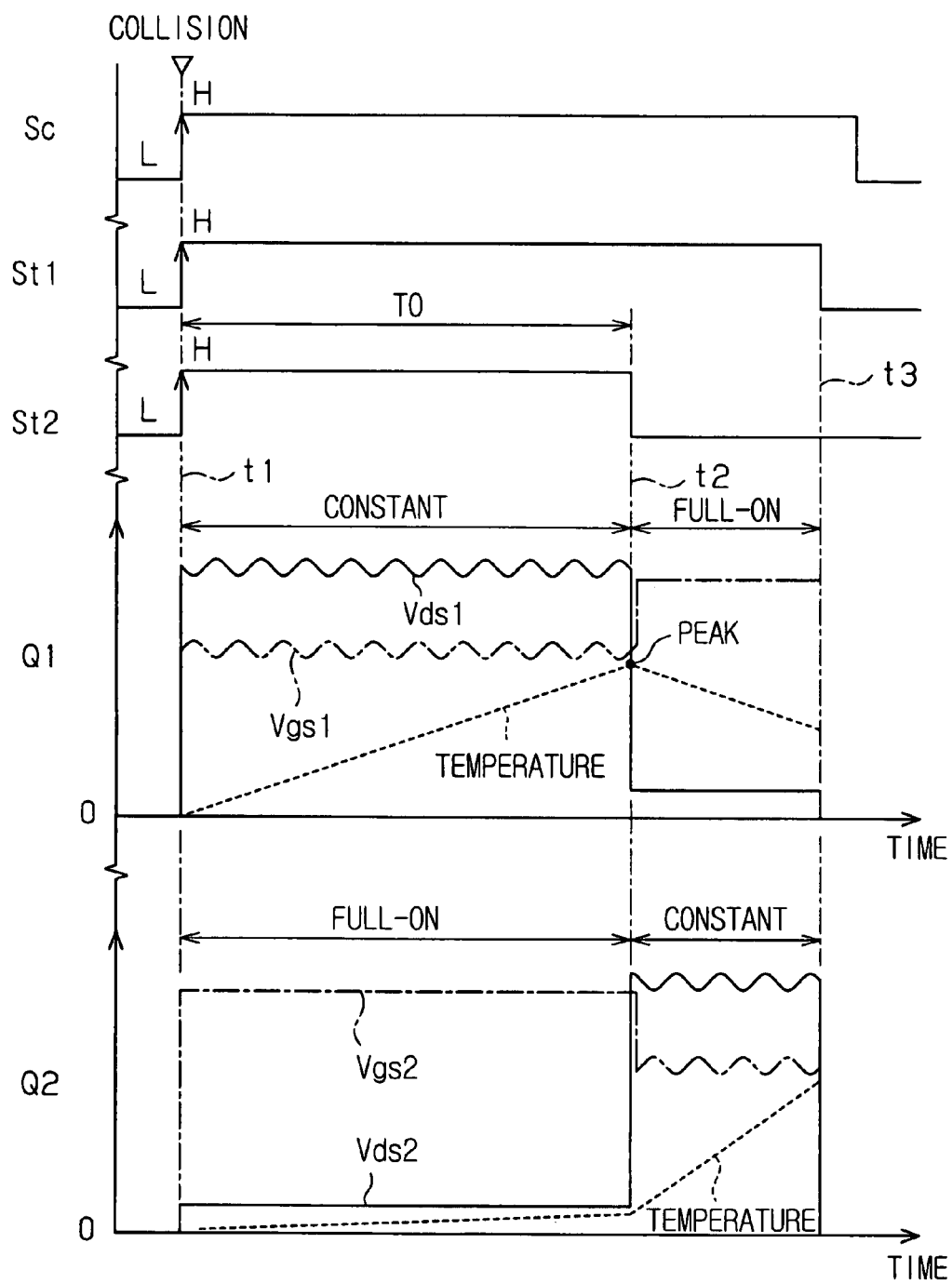
FIG. 3 is a time chart of the load drive device of FIG. 1.

As shown in a timing diagram of FIG. 3, when a collision of a vehicle occurs at a time t1, the control signal Sc of each of the control logics 27, 37 is set to the high level by a sensor signal from a collision sensor (not shown) for detecting the collision. At the same time, the first timer signal St1 of the timer 40 is also set to the high level by the sensor signal. The first timer signal St1 of the timer 40 is held high during a first time period between the time t1 and a time t3 so that the squib 10 is energized during the second time period between the times t1, t3. The second timer signal St2 of the timer 40 is also set to the high level at the time t1 by the sensor signal. The second timer signal St2 is held high during a timer period T0 between the time t1 and a time t2.

During the timer period T0, the low-side transistor Q2 operates in the full-on control mode, and the high-side transistor Q1 operates in the constant control mode. Since the second timer signal St2 is set to the high level, the result signal outputted from the comparator 23 is fed to the high-side gate driver 25 via the AND gate 24 during the timer period T0.

As shown in the time chart of FIG. 3, during the timer period T0, the gate-source voltage Vgs2 of the low-side transistor Q2 is held high so that the low-side transistor Q2 can operates in the full-on control mode. Since the low-side transistor Q2 is continuously fully turned on, the drain-source voltage Vds2 of the low-side transistor Q2 is low.

In contrast, the gate-source voltage Vgs1 of the high-side transistor Q1 is adjusted so that the high-side transistor Q1 can operate in the constant control mode. Therefore, a large portion of the power supply voltage Vdd is applied between the drain and source of the high-side transistor Q1. As a result, the drain-source voltage Vds1 of the high-side transistor Q1 becomes high.

During the timer period T0, temperature of the high-side transistor Q1 increases sharply, because the drain-source voltage Vds1 of the high-side transistor Q1 is high. In contrast, temperature of the low-side transistor Q2 increases gradually, because the drain-source voltage Vds2 of the low-side transistor Q2 is low.

Then, the second timer signal St2 of the timer 40 is set to the low level at the time t2. During a second time period between the times t2, t3, the high-side transistor Q1 operates in the full-on control mode, and the low-side transistor Q2 operates in the constant control mode. Since the second timer signal St2 of the timer 40 is set to the low level, the output of the NOT gate 41 becomes high. As a result, the result signal outputted from the comparator 33 is fed to the low-side gate driver 35 via the AND gate 34 during the second time period between the times t2, t3.

As shown in the time chart of FIG. 3, during the second time period between the times t2, t3, the gate-source voltage Vgs1 of the high-side transistor Q1 is high so that the high-side transistor Q1 can operate in the full-on control mode. Since the high-side transistor Q1 is continuously fully turned, the drain-source voltage Vds1 of the high-side transistor Q1 is low. In contrast, the gate-source voltage Vgs2 of the low-side transistor Q2 is adjusted so that the low-side transistor Q2 operates in the constant control mode. Therefore, the large portion of the power supply voltage Vdd is applied between the drain and source of the low-side transistor Q2. As a result, the drain-source voltage Vds2 of the low-side transistor Q2 becomes high.

During the second time period between the times t2, t3, the temperature of the low-side transistor Q2 increases sharply, because the drain-source voltage Vds2 of the low-side transistor Q2 is high. In contrast, the temperature of the high-side transistor Q1 decreases, because the drain-source voltage Vds1 of the high-side transistor Q1 is low.

As described above, when the squib 10 is driven, there are two states. In a first state, the high-side transistor Q1 operates in the constant control mode and the low-side transistor Q2 operates in the full-on control mode. In a second state, the high-side transistor Q1 operates in the full-on control mode and the low-side transistor Q2 operates in the constant control mode.

The timer 40 switches the high-side transistor Q1 from the constant control mode to the full-on control mode and switches the low-side transistor Q2 from the full-on control mode to the constant control mode, when the timer period T0 elapses since the collision occurs. In short, the timer 40 switches the state from the first state to the second state, when the timer period T0 elapses since the collision occurs.

Figure 15:
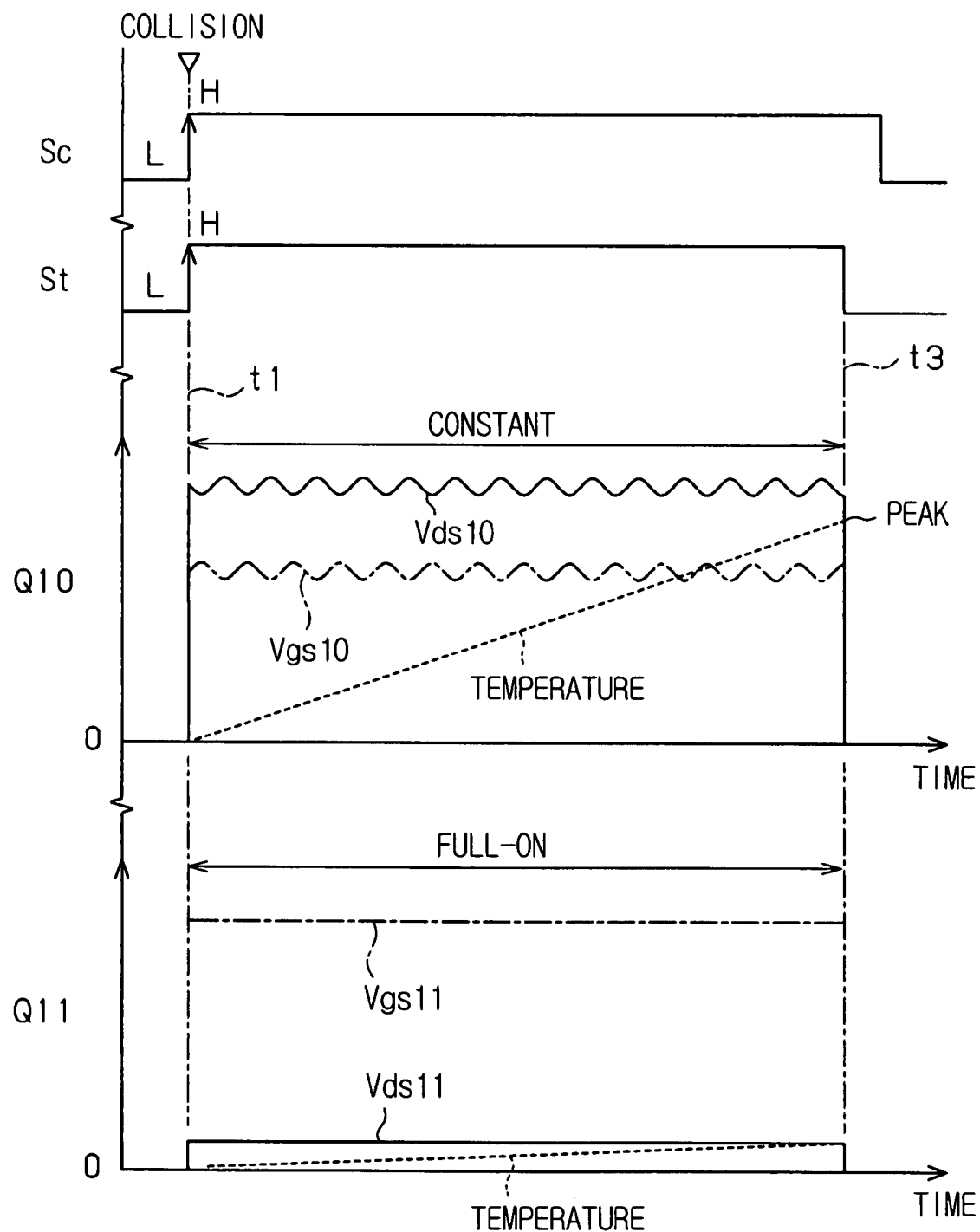
FIG. 15 is a time chart of the conventional load drive device of FIG. 14.

In such an approach, heat generated when the squib 10 is energized with the constant current is distributed between the high-side transistor Q1 and the low-side transistor Q2. As can be seen by comparing FIG. 3 with FIG. 15, peak temperature of each of the high-side and low-side transistors Q1, Q2 in the IC chip 1 is lower than that of the high-side MOSFET Q1 0 in the conventional IC chip 100.

Therefore, each of the high-side and low-side transistors Q1, Q2 can have a sufficient thermal margin and can be prevented from being thermally damaged or destroyed. Further, since the peak temperature is low, the heat generated by the high-side and low-side transistors Q1, Q2 can be prevented from affecting circuit elements in the IC chip 1 and peripheral circuits of the IC chip 1.

Figure 14:
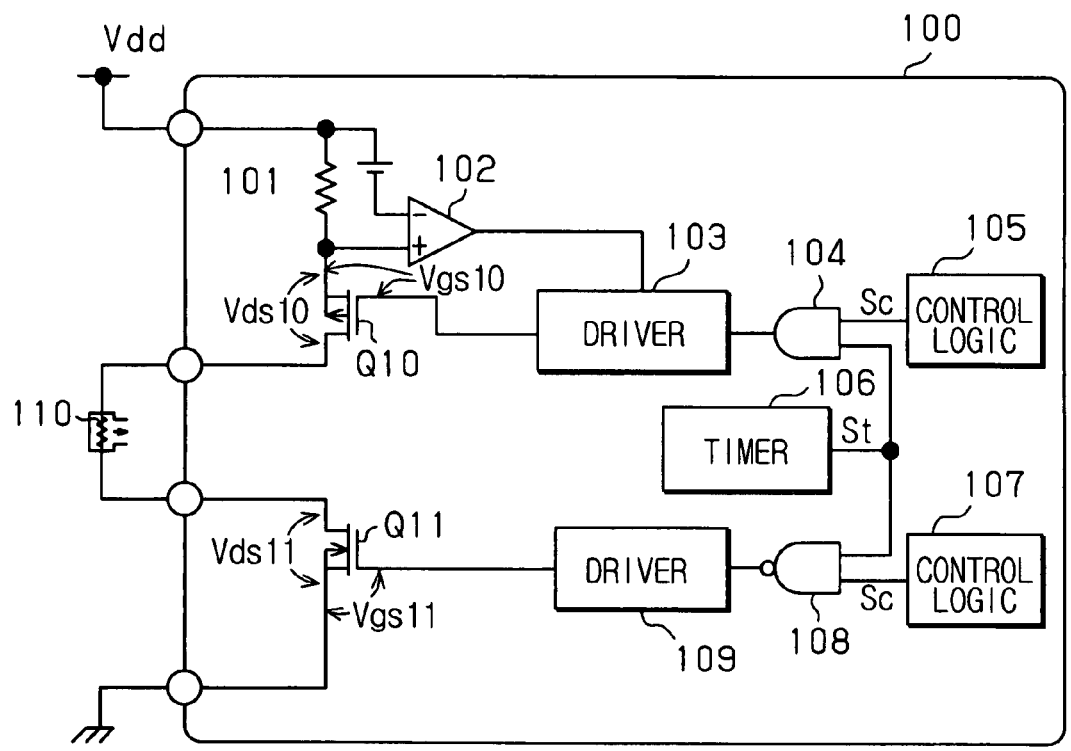
FIG. 14 is a block diagram of a conventional load drive device.

As described previously, the conventional IC chip 100 shown in FIGS. 14, 15, uses the high-side MOSFET Q10 and the low-side MOSFET Q11 to drive the squib 110 with the constant current. In the conventional IC chip 100, the high-side MOSFET Q10 generates a large portion of the heat generated when the squib 110 is driven with the constant current, despite the fact the two transistors, i.e., the high-side and low-side MOSFETs Q10, Q11 are used. As a result, the high-side MOSFET Q10 cannot have the sufficient thermal margin and may be thermally damaged or destroyed.

In contrast, in the IC chip 1, the heat generated when the squib 10 is driven with the constant current is distributed between the two transistors, i.e., the high-side and low-side transistors Q1, Q2. In such an approach, both the high-side transistor Q1 and the low-side transistor Q2 can have the sufficient thermal margin so that the thermal damage and destruction of the high-side transistor Q1 and the low-side transistor Q2 can be prevented.

According to the embodiment described above, the high-side and the low-side transistors Q1, Q2 operate in the full-on control mode or in the constant control mode, when the squib 10 is driven with the constant current. The amount of the heat generation in the constant control mode is larger than that in the full-on control mode.

The timer 40 switches the state from the first state to the second state, when a predetermined time period (i.e., the timer period T0) elapses since the load current starts to flow through the squib 10 (i.e., the collision occurs). In such an approach, the heat generated when the squib 10 is driven with the constant current is distributed between the high-side transistor Q1 and the low-side transistor Q2. Thus, each of the high-side transistor Q1 and the low-side transistor Q2 can have the sufficient thermal margin without an increase in size.

Figure 4:
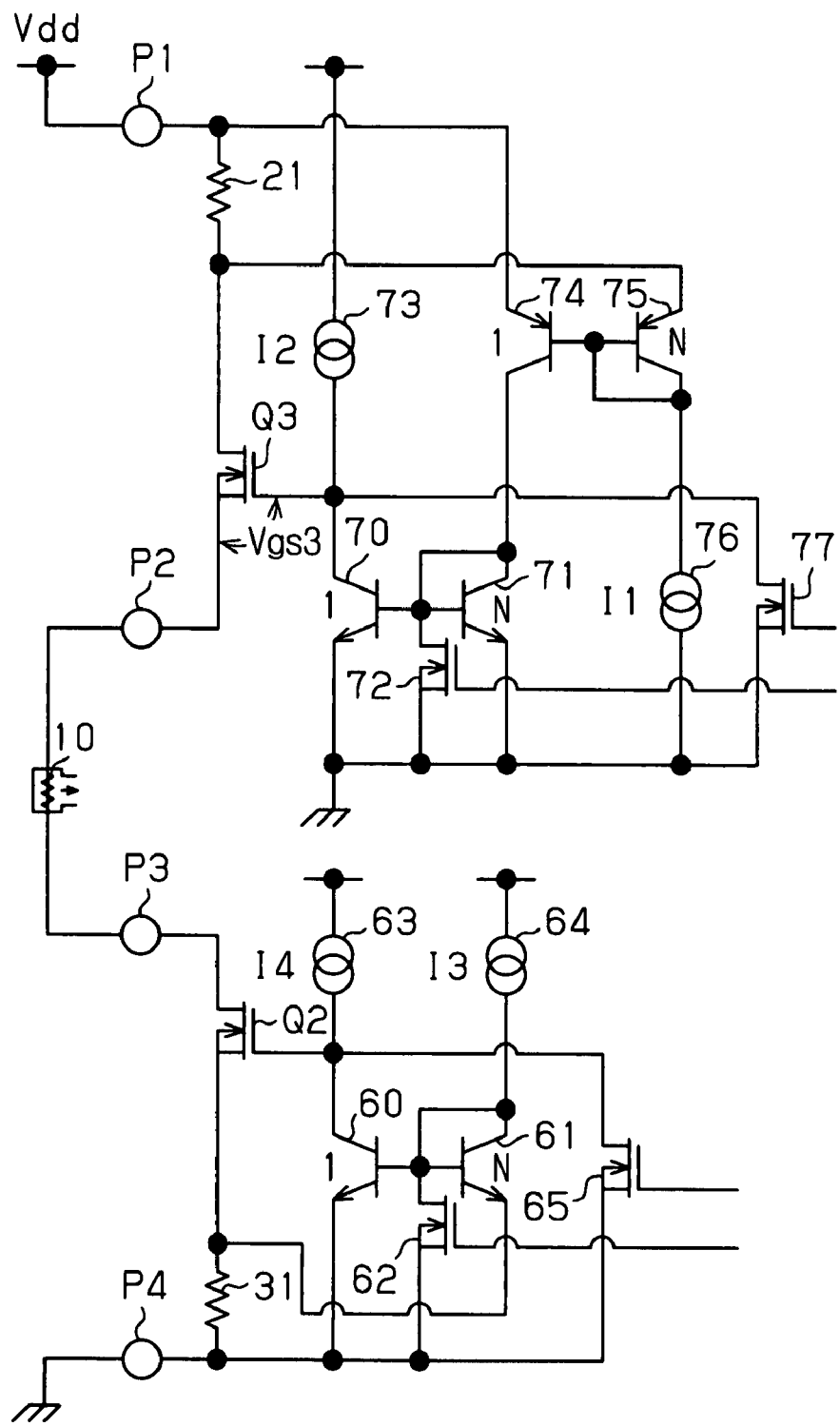
FIG. 4 is a schematic diagram of high-side and low-side drive circuits of a load drive device according to a modification of the first embodiment.

Alternatively, as shown in FIG. 4, which corresponds to FIG. 2, a high-side transistor Q3 may be used instead of the high-side transistor Q1. While the high-side transistor Q1 is the P-channel MOS transistor, the high-side transistor Q3 is a N-channel MOS transistor.

In FIG. 4, NPN transistors 70, 71 form a current mirror, and PNP transistors 74, 75 form a current mirror. The collector of the transistor 70 is connected to a constant current source 73, and the emitter of the transistor 70 is connected to a ground. Also, the collector of the transistor 70 is connected to the gate of the high-side transistor Q3. The transistors 74, 71 are connected in series between the first terminal P1 of the IC chip 1 and the ground. The emitter of the transistor 75 is connected to the node between the current detection resistor 21 and the high-side transistor Q3, and the collector of the transistor 75 is connected to a constant current source 76. A N-channel MOS transistor 77 is connected between the gate of the high-side transistor Q3 and the ground.

The high-side transistor Q3 operates in the full-on control mode as follows:

The gate of the transistor 72 is driven to the high level to turn on the transistor 72 under a condition where the transistor 77 remains off. As a result, the transistors 70, 71 are turned off so that the second current I2 can keep a gate-source voltage Vgs3 of the high-side transistor Q3 high enough to continuously fully turn on the high-side transistor Q3.

In contrast, the high-side transistor Q3 operates in the constant control mode as follows:

The gate of the transistor 72 is driven to the low level to turn off the transistor 72 under the condition where the transistor 77 remains off. The gate-source voltage Vgs3 of the high-side transistor Q3 is adjusted so that the load current flowing through the squib 10 can be held constant.

In FIG. 4, the constant current source 73 forms a first full-on means for causing the high-side transistor Q3 to operate in the full-on control mode, where the high-side transistor Q3 is continuously fully turned on. The current detection resistor 21, the transistors 70, 71, 74, 75, and the constant current sources 73, 76 form a first constant means for causing the high-side transistor Q3 to operate in the constant control mode, where the high-side transistor Q3 is controlled so that the load current flowing through the squib 10 is held constant.

Figure 5:
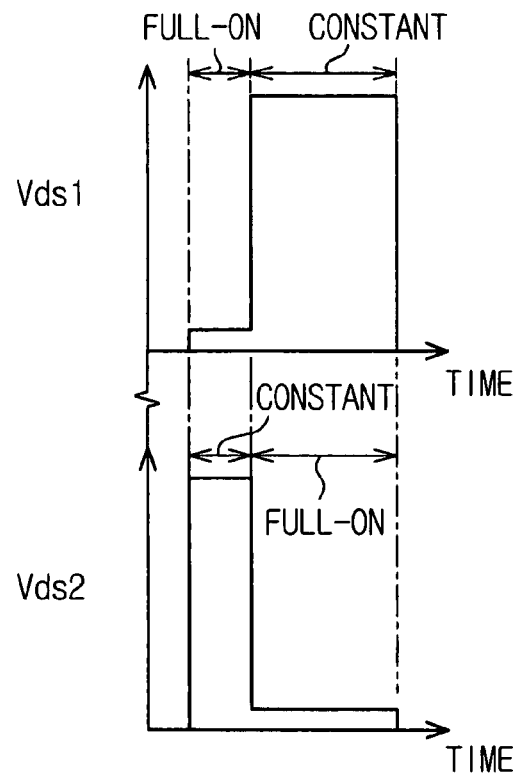
FIG. 5 is a time chart of a load drive device according to another modification of the first embodiment.

In the case of FIG. 3, the timer 40 switches the state from the first state to the second state during a time period when the squib 10 is energized. Alternatively, as shown in FIG. 5, the timer 40 may switch the state from the second state to the first state during the time period when the squib 10 is energized.

Figure 6:
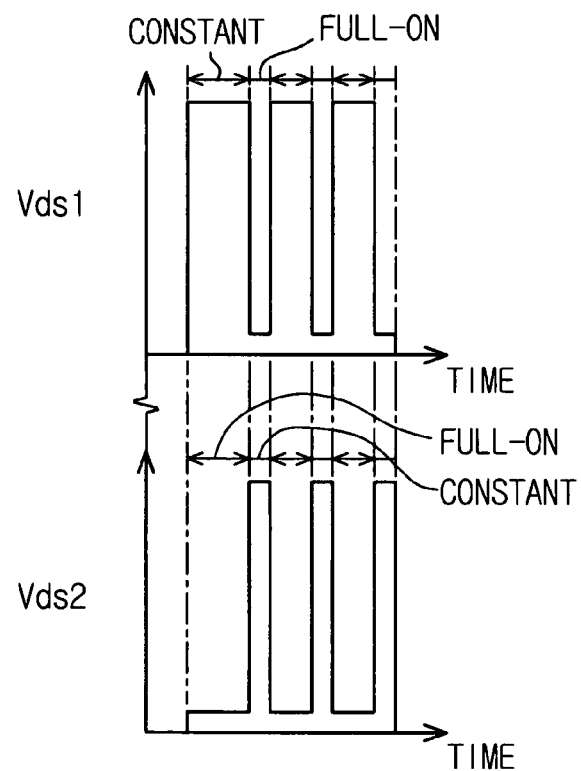
FIG. 6 is a time chart of a load drive device according to another modification of the first embodiment.

Alternatively, as shown in FIG. 6, the timer 40 may repeatedly switch the state between the first state and the second state during the time period when the squib 10 is energized.

In the case of FIG. 3, when the squib 10 is driven, there are two states, i.e., the first state and the second state. In the first state, the high-side transistor Q1 operates in the constant control mode and the low-side transistor Q2 operates in the full-on control mode. In the second state, the high-side transistor Q1 operates in the full-on control mode and the low-side transistor Q2 operates in the second mode. Therefore, a time period when the high-side transistor operates in the constant control mode does not overlap a time period when the low-side transistor operates in the constant control mode.

Figure 7:
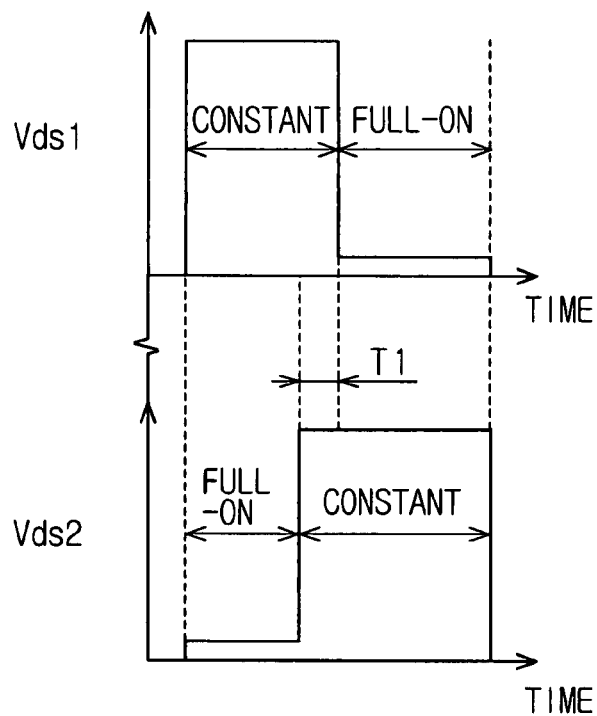
FIG. 7 is a time chart of a load drive device according to another modification of the first embodiment.
Figure 8:
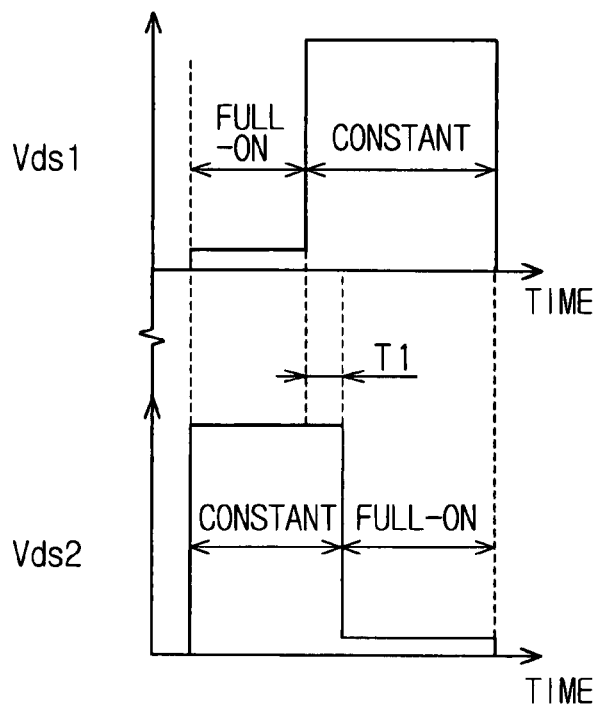
FIG. 8 is a time chart of a load drive device according to another modification of the first embodiment.

Alternatively, there may be a third state where both the high-side transistor Q1 and the low-side transistor Q2 operate in the constant control mode. The timer 40 may switch the state between the first state and the second state in such a manner that the third state is between the first state and the second state as shown in FIGS. 7, 8. In short, the time period when the high-side transistor operates in the constant control mode may partially overlap the time period when the low-side transistor operates in the constant control mode for a predetermined overlapping time period T1.

The overlapping time period T1 prevents the load current flowing though the squib 10 from increasing at the moment when the state is switched between the first state and the second state. In other words, the overlapping time period T1 allows the load current flowing though the squib 10 to be held constant at the moment when the state is switched between the first state and the second state. The overlapping time period T1 may be, for example, between several tens of nanoseconds to several hundreds of microseconds. The overlapping time period T1 may be provided by using a time lag of circuit elements.

Second Embodiment

Figure 9:
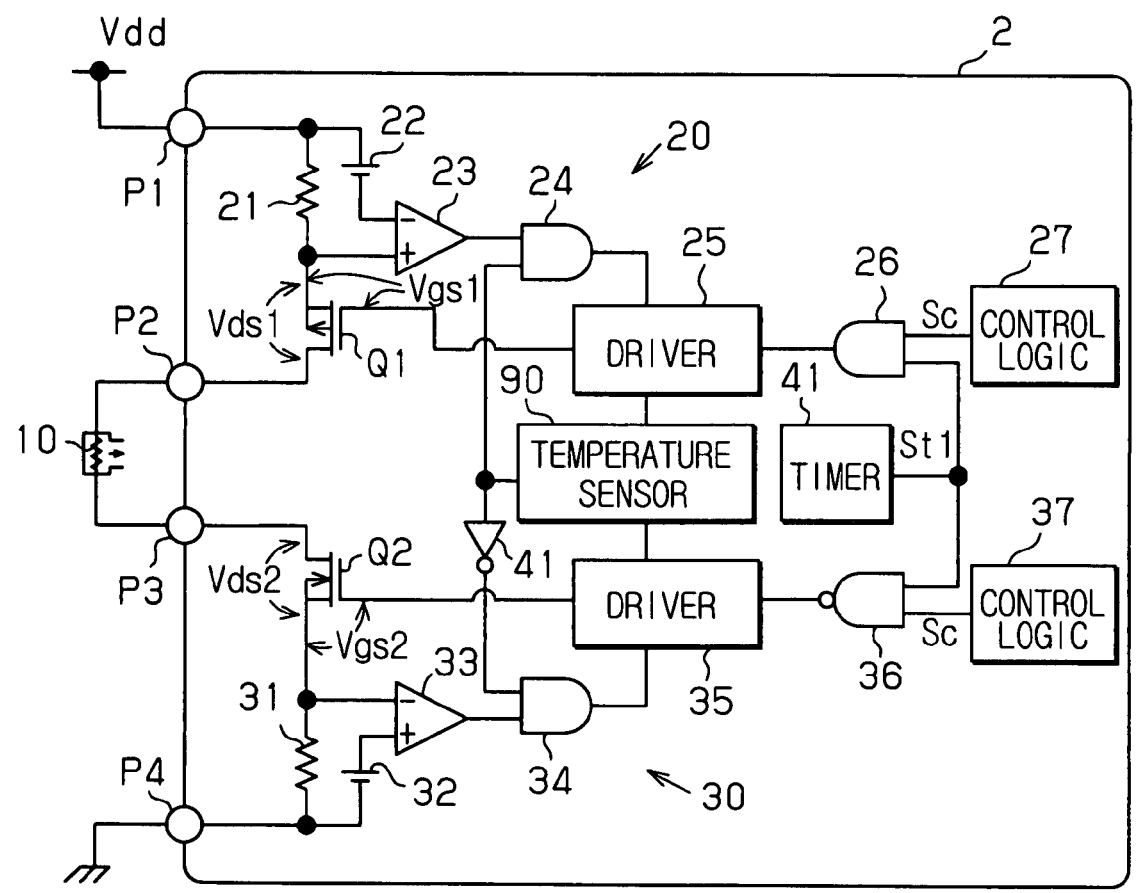
FIG. 9 is a block diagram of a load drive device according to a second embodiment of the present invention.
Figure 10:
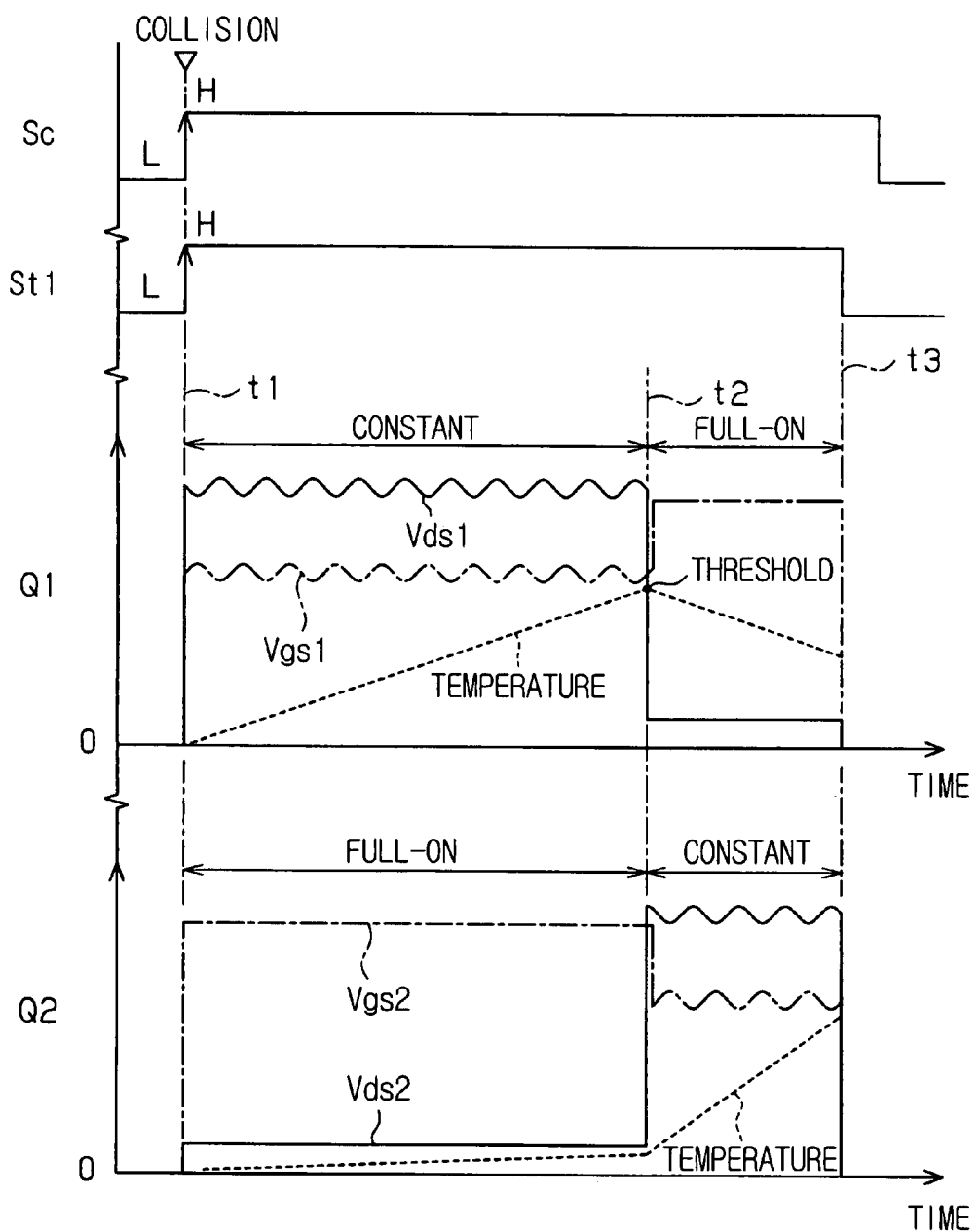
FIG. 10 is a time chart of the load drive device of FIG. 9.

An airbag squib drive circuit according to a second embodiment of the present invention is implemented on an IC chip 2 shown in FIG. 9. Differences between the IC chip 1 in the first embodiment and the IC chip 2 in the second embodiment are that the IC chip 2 further includes a timer 41, which replaces the timer 40, and a high-side temperature sensor 90 for detecting the temperature of the high-side transistor Q1. A difference between the timer 40 and the timer 41 is that the timer 41 outputs only the first timer signal St1. As shown in FIG. 10, the state is switched from the first state to the second state when the detected temperature of the high-side transistor Q1 exceeds a predetermined threshold temperature.

Figure 11:
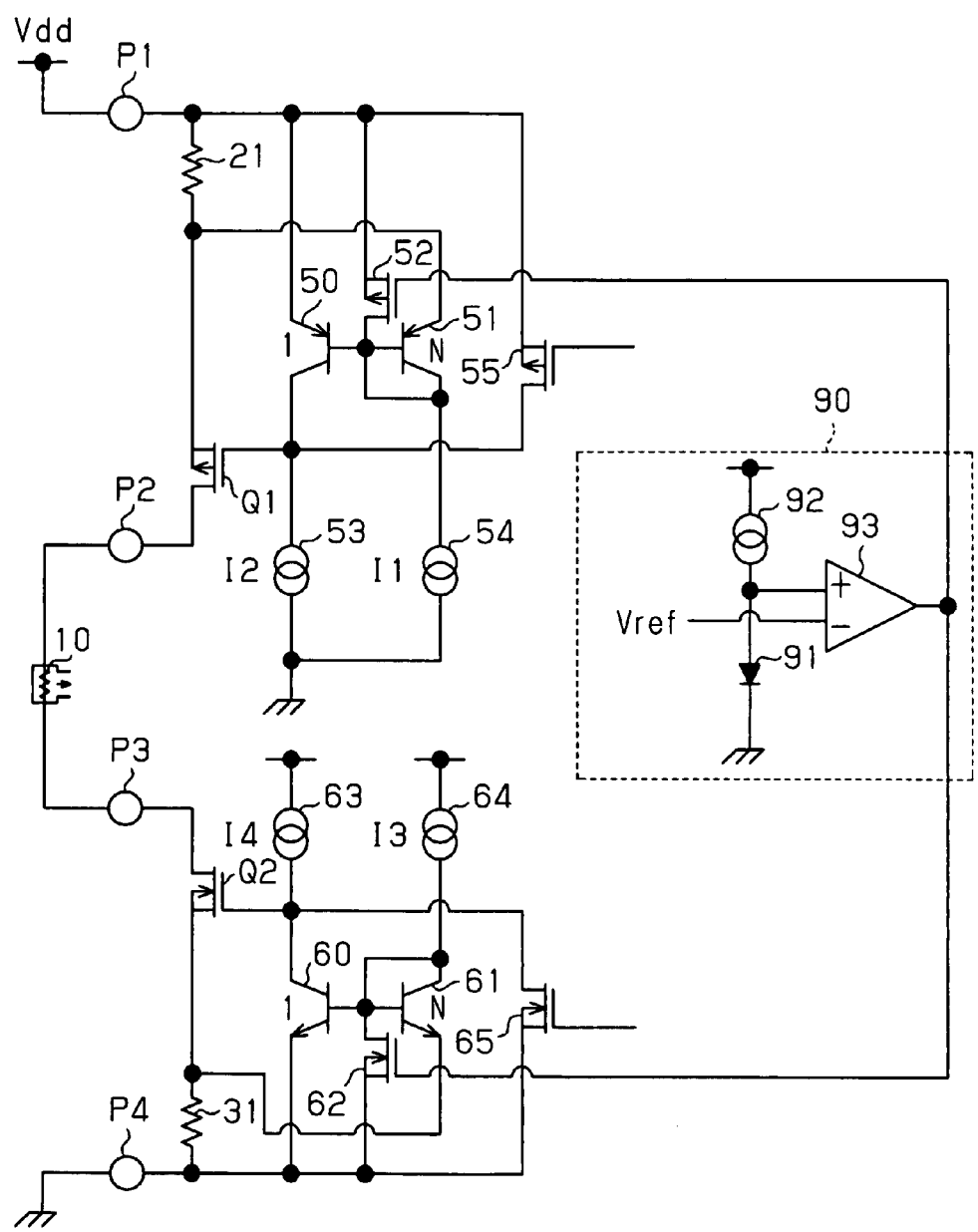
FIG. 11 is a schematic diagram of high-side and low-side drive circuits of the load drive device of FIG. 9.

As shown in FIG. 11, which corresponds to FIG. 2, the high-side temperature sensor 90 includes a diode 91, a constant current source 92, and a comparator 93. The diode 91 is arranged near the high-side transistor Q1, and the high-side temperature sensor 90 detects the temperature of the high-side transistor Q1 by using temperature characteristics of the diode 91. Specifically, as temperature of the diode 91 increases due to the fact that the temperature of the high-side transistor Q1 increases, a forward voltage across the diode 91 decreases.

The comparator 93 compares the forward voltage across the diode 91 with a reference voltage Vref. An output of the comparator 93 is fed to each of the gates of the transistors, 52, 62. When the forward voltage across the diode 91 decreases below the reference voltage Vref, an output of the comparator 93 becomes the low level. Thus, the state is switched from the first state to the second state based on the output of the comparator 93, i.e., the temperature of the high-side transistor Q1. Specifically, when the output of the comparator 93 is at the high level, the transistor 52 is off and the transistor 62 is on. Therefore, the high-side transistor Q1 operates in the constant control mode, and the low-side transistor Q2 operates in the full-on control mode. In contrast, the output of the comparator 93 becomes the low level due to the increase in the temperature of the high-side transistor Q1, the transistor 52 is tuned on and the transistor 62 is tuned off. Therefore, the high-side transistor Q1 operates in the full-on control mode, and the low-side transistor Q2 operates in the constant control mode. Thus, the high-side temperature sensor 90 switches the state from the first state to the second state, when the temperature of the high-side transistor Q1 exceeds the predetermined threshold temperature.

Figure 12:
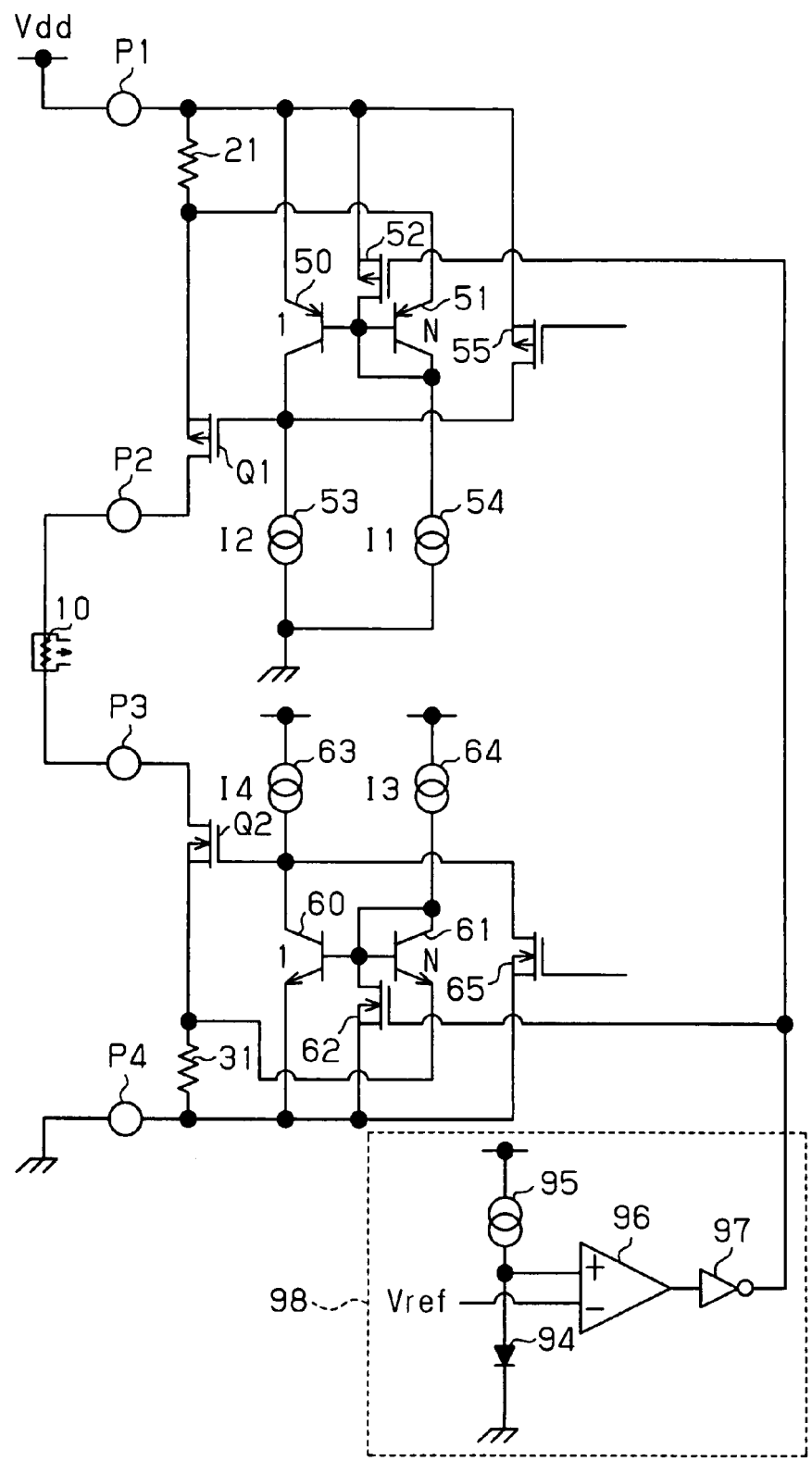
FIG. 12 is a schematic diagram of high-side and low-side drive circuits of a load drive device according to a modification of the second embodiment.

Alternatively, as shown in FIG. 12, the IC chip 2 may include a low-side temperature sensor 98 for detecting the temperature of the low-side transistor Q2, instead of the high-side temperature sensor 90 for detecting the temperature of the high-side transistor Q1. The low-side temperature sensor 98 includes a diode 94, a constant current source 95, a comparator 96, and a NOT gate 97 (i.e., inverter). The diode 94 is arranged near the low-side transistor Q2, and the low-side temperature sensor 98 detects the temperature of the low-side transistor Q2 by using temperature characteristics of the diode 94. Specifically, as temperature of the diode 94 increases due to the fact that the temperature of the low-side transistor Q2 increases, a forward voltage across the diode 94 decreases.

The comparator 96 compares the forward voltage across the diode 94 with the reference voltage Vref. An output of the comparator 96 is fed to each of the gates of the transistors, 52, 62 via the NOT gate 97. When the forward voltage across the diode 94 decreases below the reference voltage Vref, an output of the comparator 96 becomes the low level. Thus, the state is switched between the first state and the second state based on the output of the comparator 96 i.e., the temperature of the low-side transistor Q1. Specifically, when the output of the comparator 96 is at the high level, the transistor 52 is on and the transistor 62 is off. Therefore, the high-side transistor Q1 operates in the full-on control mode, and the low-side transistor Q2 operates in the constant control mode. Then, the output of the comparator 96 becomes the low level due to the increase in the temperature of the high-side transistor Q1, the transistor 52 is tuned off and the transistor 62 is tuned on. Therefore, the high-side transistor Q1 operates in the constant control mode, and the low-side transistor Q2 operates in the full-on control mode. Thus, the low-side temperature sensor 98 switches the state from the second state to the first state, when the temperature of the low-side transistor Q2 exceeds the predetermined threshold temperature.

Figure 13:
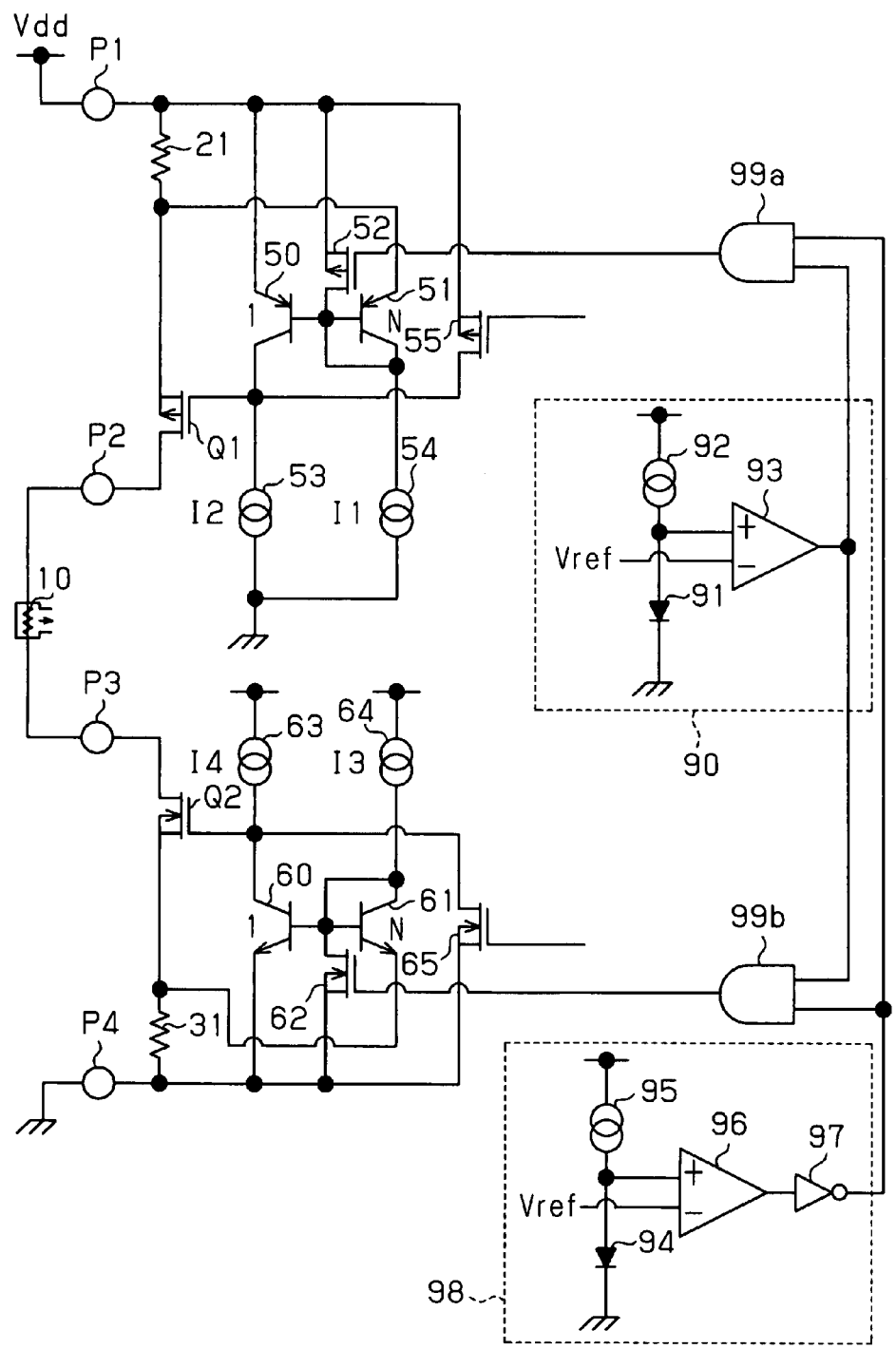
FIG. 13 is a schematic diagram of high-side and low-side drive circuits of a load drive device according to another modification of the second embodiment.

Alternatively, as shown in FIG. 13, the IC chip 2 may include both the high-side temperature sensor 90 and the low-side temperature sensor 98. The output of the high-side temperature sensor 90 is fed to the gate of the transistor 52 via an AND gate 99a and fed to the gate of the transistor 62 via an AND gate 99b. Likewise, the output of the low-side temperature sensor 98 is fed to the gate of the transistor 52 via the AND gate 99a and fed to the gate of the transistor 62 via the AND gate 99b.

When each of the temperatures of the high-side and low-side transistors Q1, Q2 is below the threshold temperature, the output of the high-side temperature sensor 90 is at the high level, and the output of the low-side temperature sensor 98 is at the low level. Therefore, the transistor 52 is on, and the transistor 62 is off. As a result, the high-side transistor Q1 operates in the full-on control mode, and the low-side transistor Q2 operates in the constant control mode.

Then, when the temperature of the low-side transistor Q2 exceeds the threshold temperature, the output of the low-side temperature sensor 98 becomes the high level. Therefore, the transistor 52 is turned off, and the transistor 62 is turned on. As a result, the high-side transistor Q1 operates in the constant control mode, and the low-side transistor Q2 operates in the full-on control mode. Thus, the high-side temperature sensor 90 and the low-side temperature sensor 98 work in conjunction with each other to switch the state from the first state to the second state.

Then, when the temperature of the high-side transistor Q1 exceeds the threshold temperature, the output of the high-side temperature sensor 90 becomes the low level. Therefore, the transistor 52 is turned on, and the transistor 62 is turned off. As a result, the high-side transistor Q1 operates in the full-on control mode, and the low-side transistor Q2 operates in the constant control mode. Thus, the high-side temperature sensor 90 and the low-side temperature sensor 98 work in conjunction with each other to switch the state from the second state to the first state.

Thus, the high-side temperature sensor 90 and the low-side temperature sensor 98 work in conjunction with each other to repeatedly switch the state between the first state and the second state.

Like the first embodiment, the time period when the high-side transistor operates in the constant control mode may partially overlap the time period when the low-side transistor operates in the constant control mode for the predetermined overlapping time period T1.

Such changes and modifications are to be understood as being within the scope of the present invention as defined by the appended claims.

What is claimed is:

1. A load drive device for driving an electrical load connected between a higher voltage terminal and a lower voltage terminal, the load drive device comprising:

a high-side transistor connected between the higher voltage terminal and the electrical load;
a low-side transistor connected between the electrical load and the lower voltage terminal;
first full-on means for causing the high-side transistor to operate in a first full-on control mode where the high-side transistor is fully tuned on;
first constant means for causing the high-side transistor to operate in a first constant control mode where the high-side transistor is controlled so that a load current flowing through the electrical load is constant;
second full-on means for causing the low-side transistor to operate in a second full-on control mode where the low-side transistor is fully tuned on;
second constant means for causing the low-side transistor to operate in a second constant control mode where the low-side transistor is controlled so that the load current flowing through the electrical load is constant; and
switching means for switching a state from a first state to a second state and/or from the second state to the first state, wherein
in the first state, the high-side transistor operates in the first constant control mode and the low-side transistor operates in the second full-on control mode, and
in the second state, the high-side transistor operates in the first full-on control mode and the low-side transistor operates in the second constant control mode.

2. The load drive device according to claim 1, wherein the switching means switches the state from the first state to the second state.

3. The load drive device according to claim 1, wherein the switching means switches the state from the second state to the first state.

4. The load drive device according to claim 1, wherein the switching means switches the state between the first state and the second state.

5. The load drive device according to claim 1, wherein the switching means switches the state based on time elapsed since the load current starts to flow through the electrical load.

6. The load drive device according to claim 1, wherein the switching means switches the state such that there is a third state between the first state and the second state, and
in the third state, the high-side transistor operates in the first constant control mode and the low-side transistor operates in the second constant control mode.

7. The load drive device according to claim 1, wherein the switching means switches the state based on temperature of at least one of the high-side and low-side transistors, and
the at least one of the high-side and low-side transistors operates in the corresponding constant control mode.

* * * * *